US012765225B2

(12) United States Patent
Song et al.

(10) Patent No.: US 12,765,225 B2
(45) Date of Patent: Oct. 13, 2026

(54) DISPLAY DEVICE

(71) Applicant: LG Display Co., Ltd., Seoul (KR)

(72) Inventors: TaeJoon Song, Paju-si (KR); ChulHo Kim, Incheon (KR); JungSik Jo, Goyang-si (KR); YunHo Kook, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 283 days.

(21) Appl. No.: 18/529,348

(22) Filed: Dec. 5, 2023

(65) Prior Publication Data

US 2024/0224709 A1 Jul. 4, 2024

(30) Foreign Application Priority Data

Dec. 30, 2022 (KR) ........................ 10-2022-0191132

(51) Int. Cl.

| | |
|---|---|
| ***H10K 59/80*** | (2023.01) |
| ***H10K 59/121*** | (2023.01) |
| ***H10K 59/123*** | (2023.01) |

(52) U.S. Cl.

CPC ..... *H10K 59/80518* (2023.02); *H10K 59/121* (2023.02); *H10K 59/123* (2023.02)

(58) Field of Classification Search

None

See application file for complete search history.

(56) References Cited

U.S. PATENT DOCUMENTS

| | | | | |
|---|---|---|---|---|
| 2004/0113550 | A1 * | 6/2004 | Adachi | H05B 33/22 313/512 |
| 2017/0194409 | A1 * | 7/2017 | Jeong | H10K 59/123 |
| 2021/0193954 | A1 | 6/2021 | Shin | |
| 2021/0226169 | A1 | 7/2021 | Yu et al. | |
| 2022/0399407 | A1 | 12/2022 | Cha et al. | |

FOREIGN PATENT DOCUMENTS

| | | | |
|---|---|---|---|
| KR | 10-2004-0051483 | A | 6/2004 |
| KR | 10-2017-0079993 | A | 7/2017 |
| KR | 10-2021-0079615 | A | 6/2021 |
| KR | 10-2022-0129601 | A | 9/2022 |
| KR | 10-2022-0166401 | A | 12/2022 |

* cited by examiner

*Primary Examiner* — Anthony Ho

(74) *Attorney, Agent, or Firm* — Birch, Stewart, Kolasch & Birch, LLP

(57) ABSTRACT

A display device includes a substrate including a non-transmissive area and a transmissive area, where the non-transmissive area has a first emission area, and the transmissive area has a second emission area. The display device further includes a first light emitting element disposed in the non-transmissive area and including a first anode electrode, a second light emitting element disposed in the transmissive area and including a second anode electrode, a thin film transistor disposed in the non-transmissive area and configured to drive at least the second light emitting element, and a transparent electrode electrically connecting the thin film transistor to the second anode electrode of the second light emitting element. Further, the structures of the first anode electrode and the second anode electrode are different from each other.

20 Claims, 8 Drawing Sheets

DISPLAY DEVICE

CROSS-REFERENCE TO RELATED APPLICATIONS

This application claims priority, under 35 U.S.C. § 119(a), to Korean Patent Application No. 10-2022-0191132 filed on Dec. 30, 2022 in the Republic of Korea, the entire contents of which are hereby expressly incorporated by reference into the present application.

BACKGROUND

Technical Field

The present disclosure relates to a display device, and more particularly, to a display device having an improved light transmittance.

Discussion of the Related Art

Recently, as our society advances toward an information-oriented society, the field of display devices for visually expressing images and information has rapidly advanced. Various display devices having excellent performance in terms of thinness, lightness, and low power consumption, are being developed correspondingly.

In particular, as multimedia functions of electronic devices are improved, the electronic devices can have cameras or sensors embedded therein. The cameras or sensors can be disposed in the bezel areas of the electronic device.

However, in order to reduce a space occupied by the camera or sensor and provide a wide screen as large as possible within a limited size of the display device, there is a need to dispose components such as the camera and the sensor within the display area of the display device, where pixels are disposed.

Further, since the camera or sensor is disposed within the display area, there is a need to dispose such components in a manner so that images can also be displayed smoothly by the display area, without affecting the performance of the display device and the camera or sensor.

SUMMARY OF THE DISCLOSURE

An object to be achieved by the present disclosure is to improve transmittance in a light-transmissive area of a display panel, simultaneously with luminous efficiency in the light-transmissive area of the display panel.

Objects of the present disclosure are not limited to the above-mentioned objects, and other objects, which are not mentioned above, can be clearly understood by those skilled in the art from the following descriptions.

A display device according to an exemplary embodiment of the present disclosure includes a substrate including a non-transmissive area and a transmissive area; a first light emitting element disposed in the non-transmissive area; a second light emitting element disposed in the transmissive area; and a thin film transistor disposed in the non-transmissive area and configured to drive the second light emitting element, wherein the first light emitting element generates light in a first emission area, wherein the second light emitting element generates light in a second emission area, and wherein the thin film transistor can be electrically connected to the second anode electrode of the second light emitting element through a transparent electrode.

Other detailed matters of the exemplary embodiments are included in the detailed description and the drawings.

A display device according to an exemplary embodiment of the present disclosure can improve an overall transmittance in a transmissive area by providing an opening through which light can travel even throughout an emission area included in the transmissive area.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
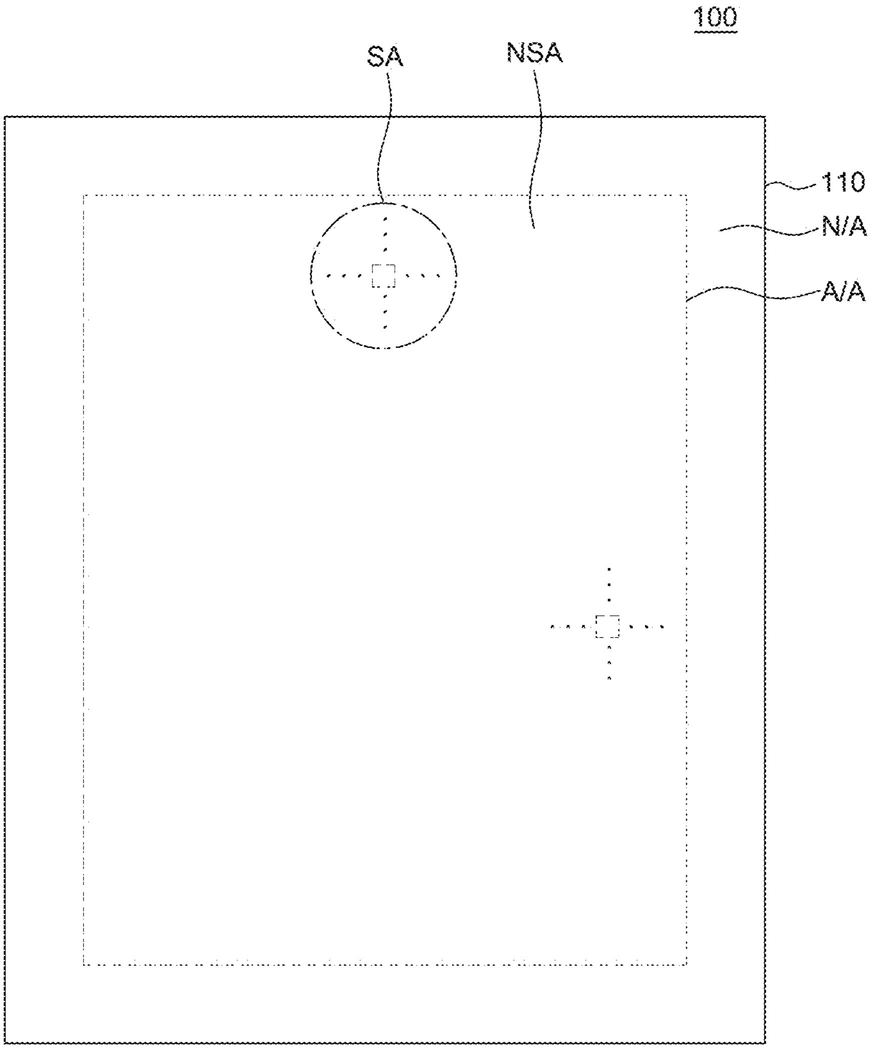
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as 'comprising', 'including', 'having', 'consist of', etc. used herein are generally intended to allow other components to be added unless the terms are used with the term 'only'. Any references to singular can include plural unless expressly stated otherwise.

Components are interpreted to include an ordinary error range even if not expressly stated.

When the position relation between two parts is described using the terms such as 'on', 'above', 'over', 'below', 'under', 'next', etc., one or more parts can be positioned between the two parts unless the terms are used with the term 'immediately' or 'directly'.

When an element or layer is disposed "on", "over", or "above" another element or layer, one or more layer(s) or element(s) can be interposed directly on the other element or therebetween.

Although the terms "first", "second", and the like are used for describing various components, these components are not confined by these terms. These terms are merely used for distinguishing one component from the other components, and may not define order or sequence. Therefore, a first component to be mentioned below can be a second component in a technical concept of the present disclosure.

A size and a thickness of each component illustrated in the drawing are illustrated for convenience of description, and the present disclosure is not limited to the size and the thickness of the component illustrated.

The term "exemplary" is used to mean an example, and is interchangeably used with the term "example". Further, embodiments are example embodiments and aspects are example aspects. Any implementation described herein as an "example" is not necessarily to be construed as preferred or advantageous over other implementations.

The features of various embodiments of the present disclosure can be partially or entirely adhered to or combined with each other and can be interlocked and operated in technically various ways, and the embodiments can be carried out independently of or in association with each other.

Transistors used in display devices according to exemplary embodiments of the present disclosure can be implemented as one of n-channel transistors (NMOS) and p-channel transistors (PMOS). The transistor can be implemented as an oxide semiconductor transistor having an oxide semiconductor as an active layer or a low temperature polysilicon (LTPS) transistor having LTPS as an active layer. The transistor can include at least a gate electrode, a source electrode, and a drain electrode. The transistor can be implemented as a thin film transistor TFT on a substrate 110.

According to aspects of the present disclosure, in the transistor, carriers flow from the source electrode to the drain electrode. In the case of the n-channel transistor (NMOS), since carriers are electrons, a source voltage can have a voltage level lower than that of a drain voltage so that the electrons can flow from the source electrode to the drain electrode. In the n-channel transistor (NMOS), current flows in a direction from the drain electrode to the source electrode, and the source electrode can be an output terminal. In the case of the p-channel transistor (PMOS), since carriers are holes, a source voltage can have a voltage level higher than that of a drain voltage so that the holes can flow from the source electrode to the drain electrode. In the p-channel transistor (PMOS), since the holes flow from the source electrode to the drain electrode, current flows from a source to a drain of the transistor, and the drain electrode can be an output terminal. Accordingly, it should be noted that the source and drain of the transistor are not fixed because the source and drain can change according to a voltage applied thereto. In the disclosure, descriptions are made assuming that the transistor is an n-channel transistor (NMOS), but it is not limited thereto, and a p-channel transistor can be used therefor and accordingly, a circuit configuration can be changed.

Further, according to aspects of the present disclosure, gate signals of the transistors used as switching elements can swing between a gate-on voltage and a gate-off voltage. The gate-on voltage can be set to a voltage higher than a threshold voltage (Vth) of the transistor, and the gate-off voltage can be set to a voltage lower than the threshold voltage (Vth) of the transistor. The transistor can be turned on in response to the gate-on voltage, while being turned off in response to the gate-off voltage. In the case of the n-channel transistor (NMOS), the gate-on voltage can be a gate high voltage (VGH), and the gate-off voltage can be a gate low voltage (VGL). In the case of the p-channel transistor (PMOS), the gate-on voltage can be the gate low voltage (VGL), and the gate-off voltage can be the gate high voltage (VGH).

Hereinafter, various embodiments of the present disclosure will be described in detail with reference to the accompanying drawings. All the components of each display device according to all embodiments of the present disclosure are operatively coupled and configured.

FIG. 1 is a schematic plan view of a display device according to an exemplary embodiment of the present disclosure.

Referring to FIG. 1, a display device 100 can include a substrate 110 including a display area (active area) A/A and a non-display area (non-active area) N/A. A plurality of pixels can be disposed in the display area A/A. For example, the plurality of pixels can include one or more light emitting elements. Each of the plurality of pixels can include a plurality of sub-pixels, which can be configured to emit different colors such as red, blue, green, etc. The plurality of sub-pixels can be arranged in a matric configuration or in other configurations. The display device 100 can display an image on the display area A/A by driving the pixels in response to input image data.

The display area A/A includes a sensor area SA and a non-sensor area NSA. One or more pixels are disposed in each of the sensor area SA and the non-sensor area NSA. The sensor area SA can have transmittance higher than that of the non-sensor area NSA, and a camera and/or a sensor can be disposed in the sensor area SA, e.g., in a rear direction of the sensor area SA. The sensor can be an infrared sensor or any other types of sensors. Also a camera can be considered a sensor. The display device not only generates light in a front direction from the sensor area SA, but can also acquire external information using a camera and/or a sensor provided in the rear direction. In the following specification, for convenience of explanation, an example in which a camera is disposed on a rear surface of the sensor area SA, is mainly described, but various embodiments of the present disclosure are not limited to such an example. In addition, various sensors can be disposed in the rear direction of the sensor area SA, instead of a camera or together with the camera.

Further, the display area A/A can include one or more sensor areas SA and one or more non-sensor areas NSA. The sensor and/or non-sensor areas SA and NSA can be located together in one region of the display area A/A, or can be located in multiple regions of the display area A/A. The non-sensor area NSA can surround the sensor area SA entirely or only in part.

In addition, the non-display area N/A can surround the display area A/A entirely or only in part. The display device 100 (or any other display device of the embodiments of the present disclosure) can be a flexible display, a bendable display, a rollable display, a flat display, a curved display, etc.

The pixels disposed in the sensor area SA and the pixels disposed in the non-sensor area NSA can be at least partially differently disposed or can have at least partially different structures. For example, the pixels disposed in the sensor area SA can or should have functions of emitting light in the front direction (e.g., viewable by a user), as well as having functions of receiving external light in a rear direction (e.g., to perform a sensing function). Thus, the pixels disposed in the sensor area SA can be disposed to have an opening ratio or transmittance which increases throughout the sensor area SA or which varies within the sensor area SA, or can have a structure for this purpose. In contrast, the pixels disposed in the non-sensor area NSA is mainly intended to emit light with high efficiency in the front direction, so the pixels disposed in the non-sensor area NSA are disposed such that light generated from light emitting diodes (e.g., organic light emitting diodes) or any main light source of the display device is emitted as much as possible in the front direction, or can have a structure for this purpose.

For example, transmissive areas (e.g., TA in FIG. 2) can be formed in the sensor area SA to increase transmittance or an opening ratio, and further, electrodes constituting the organic light emitting diodes can be configured as transparent electrodes. For example, in the non-sensor area NSA, a reflective layer can be disposed around the organic light emitting diodes to prevent light from escaping in a rear direction or an inclined surface direction, or a part of the electrodes constituting the organic light emitting diodes can be configured to function as a reflective layer. However, various embodiments of the present disclosure are not limited to such examples, and more diverse arrangements or structures can be applied to the sensor area SA and the non-sensor area NSA, which will be discussed now.

Figure 2:
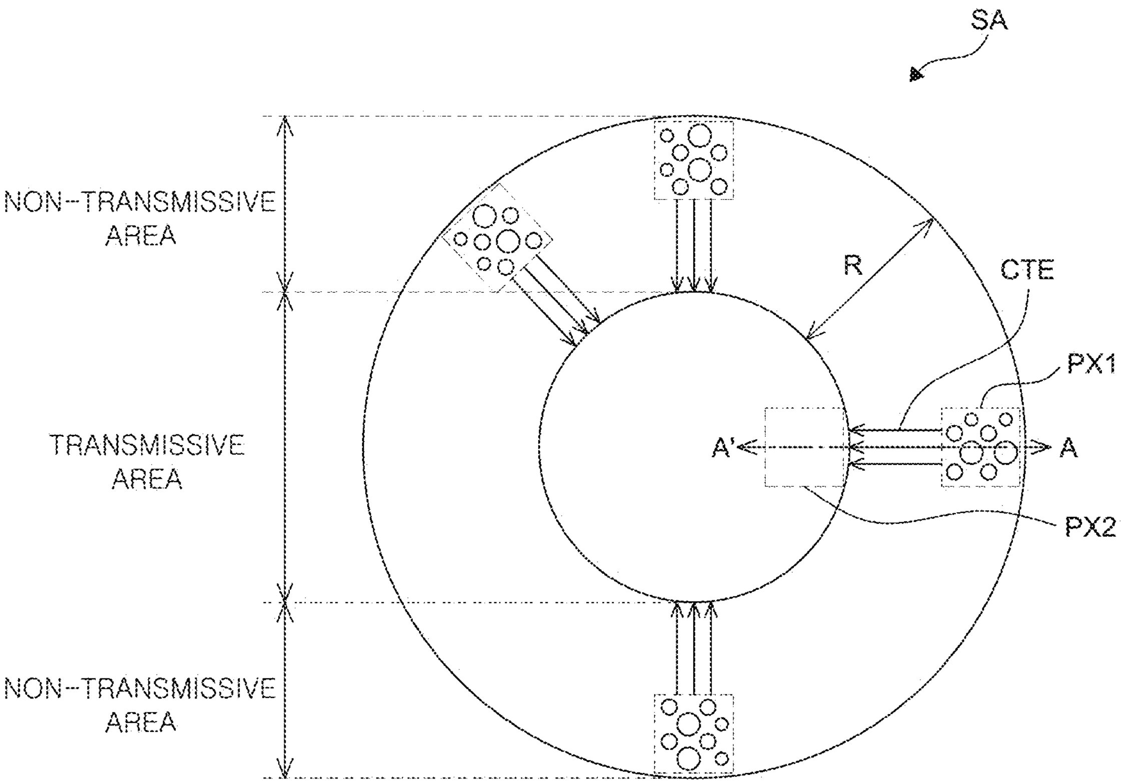
FIG. 2 is a view illustrating an example of a sensor area of FIG. 1.

FIG. 2 is a view illustrating an example of the sensor area SA of FIG. 1.

Referring to FIG. 2, the sensor area SA includes a non-transmissive area NTA and a transmissive area TA.

The transmissive area TA is an area with high transmittance, and a camera and/or sensor (e.g., infrared sensor) located in the rear direction of the sensor area SA can detect light incident through the transmissive area TA. The non-transmissive area NTA is an area that has little or low transmittance or is designed to reflect light, and various non-transmissive components such as driving transistors can be disposed in the non-transmissive area NTA. In this regard, the non-transmissive area NTA can be considered a low transmissive area compared to the transmissive area TA. For instance, the non-transmissive area NTA has low transmittance, so that no light (or very little light) in that area is transmitted thereto, and all light in that area is reflected towards the front/top surface of the sensor area SA. The transmissive area TA has high transmittance, so that some light is transmitted thereto towards the bottom/rear surface of the sensor area SA and the camera/sensor in that area can detect such light for processing or other operations. The non-transmissive area NTA and the transmissive area TA can be referred to, respectively, as first and second transmittance areas having significantly different transmittances.

A plurality of first pixels PX1 can be disposed in the non-transmissive area NTA. Specifically, the plurality of pixels and thin film transistor(s) for driving them can be disposed in the non-transmissive area NTA. The thin film transistors include, for example, a driving transistor and a switching transistor, but various embodiments of the present disclosure are not limited to such an example. Thin film transistors are generally formed of a non-transmissive material, so light does not transmit through an area where the thin film transistor is disposed.

A plurality of second pixels PX2 can be disposed in the transmissive area TA. Specifically, the plurality of pixels are disposed in the transmissive area TA, but the thin film transistor(s) for driving the disposed pixels can be disposed on the non-transmissive area NTA. The thin film transistors disposed in the non-transmissive area NTA and the pixels disposed in the transmissive area TA are electrically connected, and the pixels can be driven according to voltages applied from such thin film transistors. In an example, the first pixels PX1 can be disposed and arranged repeatedly to each other so as to fill or cover the non-transmissive area NTA or a majority part thereof. Similarly, the second pixels PX2 can be disposed and arranged repeatedly to each other so as to fill or cover the transmissive area TA or a majority part thereof One of a source electrode and a drain electrode of the driving transistor can be electrically connected to a high potential voltage line, and the other thereof can be electrically connected to an anode electrode of a diode. Specifically, the other of the source electrode and the drain electrode of the driving transistor can be electrically connected to a common transparent electrode extending in one direction, and the common transparent electrode can be electrically connected to the anode electrode of the diode. The common transparent electrode can located starting from the non-transparent area NTA and extend to the transmissive area TA, and the pixels (s) disposed in the transmissive area TA can be electrically connected to the common transparent electrode extended above. In the present disclosure, the diode is a light emitting element constituting a sub-pixel. The terms "diode" and "sub-pixel" can be used interchangeably, and the pixel can be understood to include a plurality of sub-pixels.

The common transparent electrode can be electrically connected to each of the sub-pixels disposed in the transmissive area TA and the non-transmissive area NTA. For example, one common transparent electrode extending in one direction can be electrically connected not only to the diode disposed in the non-transmissive area NTA but also to the diode disposed in the transmissive area TA. In other words, one common transparent electrode extending in one direction can be electrically connected to two or more sub-pixels, and the sub-pixels can be disposed in each of the non-transmissive area NTA and the transmissive area TA. In this manner, the common transparent electrode electrically connected to the two or more pixels can be disposed in the non-transmissive area NTA located adjacent to the transmissive area TA.

Although various embodiments of the present disclosure are not limited to, in an exemplary embodiment, the sensor area SA can be configured in a circular shape as shown in FIG. 2. Additionally, the transmissive area TA and non-transmissive area NTA constituting the sensor area SA can also be configured in circular shapes. For instance, the transmissive area TA can be a circle, whereas the non-transmissive area can be a concentric circle that is disposed outside and excludes the circle of the transmissive area TA. The sensor area SA and the transmissive area TA are configured as circular areas with different radii based on the same or substantially the same origin (e.g., center), and a remaining area of the sensor area SA excluding the transmissive area TA can be configured as the non-transmissive area NTA. Accordingly, the non-transmissive area NTA can be formed to have a constant width R and surround the transmissive area TA. As a variation, if different shapes are used for the transmissive area TA and/or non-transmissive area NTA, the width R may not be constant, and there can be multiple different widths R for the non-transmissive area NTA.

In addition, although various embodiments of the present disclosure are not limited to, in an exemplary embodiment, the common transparent electrode can be formed to extend in a radial direction. As an example, the common transparent electrode starts from the non-transmissive area NTA and extends to (i.e., into) the transmissive area TA. In this case, the common transparent electrode can extend toward the origin (or center) of the transmissive area TA. As a result, the common transparent electrode disposed on an upper portion of the non-transmissive area NTA can start from the upper portion and extend downward and be electrically connected to the anode electrode of the diode disposed in the transmissive area TA. Additionally, the common transparent electrode disposed on a lower portion of the non-transmissive area NTA can start from the lower portion and extend upward and be electrically connected to the anode electrode of the diode disposed in the transmissive area TA.

Figure 3:
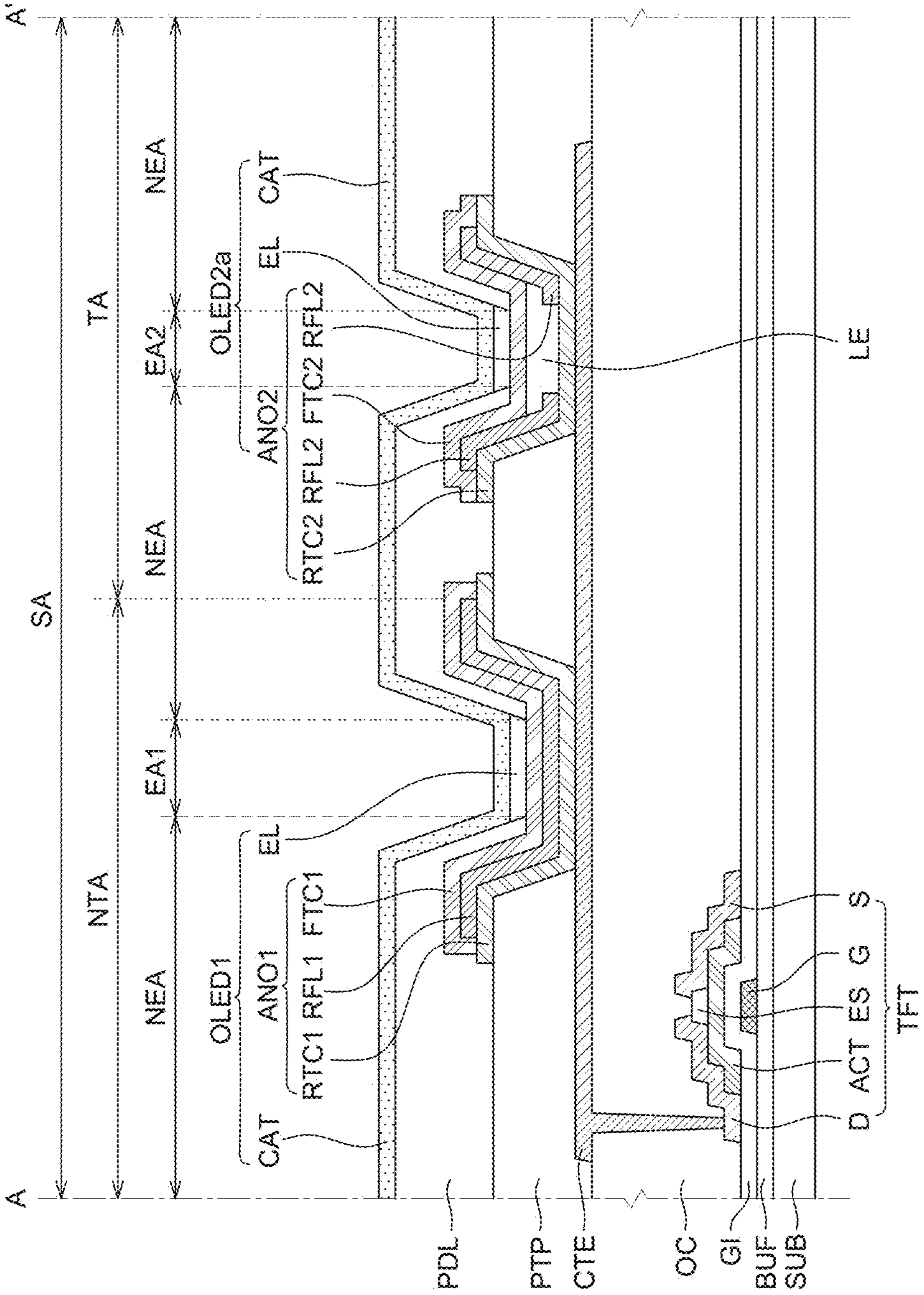
FIG. 3 is a cross-sectional view of a display device according to an exemplary embodiment of the present disclosure, and more specifically illustrates an example of a cross-section taken along line A-A' of the display device of FIG. 2.

FIG. 3 is a cross-sectional view of a display device according to an exemplary embodiment of the present disclosure. Specifically, FIG. 3 exemplarily illustrates one example of a cross-section taken along line A-A' of the display device of FIG. 2.

Referring to FIG. 3, a substrate SUB is a substrate for supporting and protecting various components of a display device 100 which can be a light emitting display device. The substrate SUB can be formed of glass or a plastic material with flexibility. If the substrate SUB is formed of a plastic material, for example, it can be formed of polyimide (PI). However, various embodiments of the present disclosure are not limited thereto.

A buffer layer BUF is disposed on the substrate SUB. The buffer layer BUF can improve adhesion between layers formed on the buffer layer BUF and the substrate SUB and block alkaline components leaking out from the substrate SUB. The buffer layer BUF can be formed of a single layer of silicon nitride (SiNx) or silicon oxide (SiOx) or multiple layers of silicon nitride (SiNx) or silicon oxide (SiOx), but various embodiments of the present disclosure are not limited thereto. The buffer layer BUF can be omitted based on a type and material of the substrate SUB, a structure and type of a thin film transistor TFT, and the like.

The thin film transistor TFT is disposed on the substrate SUB. The thin film transistor TFT can be used as a driving element of the light emitting display device 100. The thin film transistor TFT includes a gate electrode G, an active layer ACT, a source electrode S, and a drain electrode D. In the light emitting display device 100 according to an exemplary embodiment of the present disclosure, the thin film transistor TFT has a structure in which the active layer ACT is disposed on the gate electrode G, and the source electrode S and the drain electrode D are disposed on the active layer ACT, so the thin film transistor TFT is a thin film transistor having a bottom gate structure in which the gate electrode G is disposed at a lowest location. However, various embodiments of the present disclosure are not limited to thereto, and a thin film transistor with a top gate structure can also be applied.

The gate electrode G of the thin film transistor TFT is disposed on the substrate SUB. The gate electrode G can be formed of any one of various metal materials, such as molybdenum (Mo), aluminum (Al), chromium (Cr), gold (Au), titanium (Ti), nickel (Ni), neodymium (Nd), and copper (Cu), an alloy of two or more of them, or multiple layers thereof, but various embodiments of the present disclosure are not limited thereto.

A gate insulating layer GI is disposed on the gate electrode G. The gate insulating layer GI is a layer for electrically insulating the gate electrode G and the active layer ACT, and can be formed of an insulating material. For example, the gate insulating layer GI can be composed of a single layer of silicon nitride (SiNx) or silicon oxide (SiOx) which is an inorganic material, or multiple layers of silicon nitride (SiNx) or silicon oxide (SiOx), but various embodiments of the present disclosure are not limited thereto.

The active layer ACT is disposed on the gate insulating layer GI. The active layer ACT is disposed to overlap the gate electrode G. For example, the active layer ACT can be formed of an oxide semiconductor, amorphous silicon (a-Si), polycrystalline silicon (poly-Si), or organic semiconductor.

An etch stopper ES is disposed on the active layer ACT. The etch stopper ES can be a layer formed to prevent a surface of the active layer ACT from being damaged by plasma when the source electrode S and the drain electrode D are patterned using an etching method. One end of the etch stopper ES can overlap the source electrode S, and the other end thereof can overlap the drain electrode D. However, the etch stopper ES can be omitted.

The source electrode S and the drain electrode D are disposed on the active layer ACT and the etch stopper ES. The source electrode S and the drain electrode D are disposed on the same layer to be spaced apart from each other. The source electrode S and the drain electrode D can be electrically connected to the active layer ACT in a manner in which they contact the active layer ACT. The source electrode S and drain electrode D can be formed of any one of various metal materials, such as molybdenum (Mo), aluminum (Al), chromium (Cr), gold (Au), titanium (Ti), nickel (Ni), neodymium (Nd), and copper (Cu), an alloy of two or more of them, or multiple layers thereof, but various embodiments of the present disclosure are not limited thereto.

An overcoating layer OC is disposed on the thin film transistor TFT. The overcoating layer OC is an insulating layer that protects the thin film transistor TFT and alleviates steps between layers disposed on the substrate SUB. A flat surface of a common transparent electrode CTE has a surface parallel to the substrate SUB. Accordingly, the common transparent electrode CTE can flatten steps that can be caused by components disposed therebelow. For example, a step that can be caused by the thin film transistor TFT disposed below the overcoating layer OC can be flattened. The overcoating layer OC can be formed of one of acrylic resin, epoxy resin, phenol resin, polyamide resin, polyimide resin, unsaturated polyester resin, polyphenylene resin, polyphenylene sulfide resin, and benzocyclobutene. However, various embodiments of the present disclosure are not limited thereto.

A transparent electrode is disposed on the overcoating layer OC. In this case, the transparent electrode can be referred to as the common transparent electrode CTE. The common transparent electrode CTE can be disposed on the flat surface of the overcoating layer OC. One surface (e.g., a rear surface) of the common transparent electrode CTE can be electrically connected to the drain electrode D of the thin film transistor TFT through a contact hole formed in the overcoating layer OC. In addition, the other surface (e.g., a front surface) of the common transparent electrode CTE can be electrically connected to anode electrodes (e.g., a first anode electrode ANO1 and a second anode electrode ANO2) constituting light emitting elements (e.g., a first light emitting element OLED1 and a second light emitting element OLED2*a*). For instance, the common transparent electrode CTE contacts the first anode electrode ANO1 and the second anode electrode ANO2. The common transparent electrode CTE can transmit a driving voltage supplied from the thin film transistor TFT to the anode electrodes ANO1 and ANO2 of the light emitting elements OLED1 and OLED2*a*, and the light emitting elements OLED1 and OLED2*a* can generate light based on the driving voltage.

A protrusion pattern PTP is disposed on the common transparent electrode CTE. The protrusion pattern PTP can be formed of an organic insulating material. The protrusion pattern PTP has an opening that at least partially exposes the front surface (e.g., top surface) of the common transparent electrode CTE. The opening is formed to be gradually narrower in width in a rear (e.g., bottom) direction from the front, and accordingly, the protrusion pattern PTP includes a flat surface and an inclined surface. The flat surface of the protrusion pattern PTP is a surface located at a top of the protrusion pattern PTP and can be a surface that is parallel or substantially parallel to the common transparent electrode CTE or the substrate SUB. The inclined surface of the protrusion pattern PTP can be a surface that connects the flat surface of the protrusion pattern PTP and a portion of the common transparent electrode CTE in which the front surface is exposed by the opening.

The first light emitting element OLED1 and the second light emitting element OLED2*a* are disposed on the common transparent electrode CTE. The first light emitting element OLED1 is disposed in the non-transmissive area NTA, and the second light emitting element OLED2*a* is disposed in the transmissive area TA. In one example, the first light emitting element OLED1 includes a reflective layer (e.g., a first reflective layer RFL1) in an emission area (e.g., a first emission area EA1), so that light is not introduced in the rear direction. In one example, the second light emitting element OLED2*a* does not include a reflective layer (e.g., a second reflective layer RFL2) in an emission area (e.g., a second emission area EA2), so that light can be introduced in the rear direction. For instance, the second reflective layer RFL2 is not present in the second emission area EA2.

The first light emitting element OLED1 includes the first anode electrode ANO1, a light emitting layer EL, and a cathode electrode CAT. The first anode electrode ANO1, the light emitting layer EL, and the cathode electrode CAT can be sequentially stacked in the front direction (e.g., towards the front surface of the sensor area SA).

The first anode electrode ANO1 can include a first lower transparent conductive layer RTC1, a first upper transparent conductive layer FTC1, and the first reflective layer RFL1 that are electrically connected to the thin film transistor TFT. The first reflective layer RFL1 can be disposed between the first lower transparent conductive layer RTC1 and the first upper transparent conductive layer FTC1. The first lower transparent conductive layer RTC1 is electrically connected to the common transparent electrode CTE, and the first upper transparent conductive layer FTC1 is electrically connected to the light emitting layer EL. The first upper transparent conductive layer FTC1 and the first lower transparent conductive layer RTC1 can at least partially contact each other, but various embodiments of the present disclosure are not limited thereto. The first upper transparent conductive layer FTC1 and the first lower transparent conductive layer RTC1 can be spaced apart from each other by the first reflective layer RFL1 disposed therebetween.

The first anode electrode ANO1 is disposed on the common transparent electrode CTE to cover the inclined surface of the protrusion pattern PTP. For example, the first anode electrode ANO1 is disposed on at least portions of the flat surface of the common transparent electrode CTE on which the protrusion pattern PTP is not disposed, the inclined surface of the protrusion pattern PTP, and the flat surface of the protrusion pattern PTP. The first anode electrode ANO1 is disposed along shapes (e.g., following the outer surfaces) of the common transparent electrode CTE and the protrusion pattern PTP. In one example, the first upper transparent conductive layer FTC1, the first lower transparent conductive layer RTC1, and the first reflective layer RFL1 can be disposed along the shapes (e.g., following the outer surfaces) of the common transparent electrode CTE and the protrusion pattern PTP. Meanwhile, according to various embodiments of the present disclosure, the first anode electrode ANO1 can be disposed only along the flat surface of the common transparent electrode CTE on which the protrusion pattern PTP is not disposed, and along the inclined surface of the protrusion pattern PTP. For example, the entire first anode electrode ANO1 can be contained within the protrusion pattern PTP so that the top surface of the first upper transparent conductive layer FTC1 and the top surface of the protrusion pattern PTP can be coplanar or substantially coplanar.

The first reflective layer RFL1 of the first anode electrode ANO1 is disposed on the first lower transparent conductive layer RTC1. Since the display device according to various embodiments of the present disclosure is a light emitting display device of a top emission type, the first reflective layer RFL1 reflects light emitted from the first light emitting element OLED1 to a front surface thereof (e.g., the front direction).

Light generated in the light emitting layer EL of the light emitting element can be emitted not only to the front surface thereof, but can also be emitted to an inclined surface thereof. Light emitted from the inclined surface is directed to an inside of the light emitting display device and can be trapped inside the light emitting display device by total reflection. The light trapped inside the light emitting display device can travel in a direction toward the inside of the light emitting display device and then, disappear. Accordingly, the first reflective layer RFL1 can be disposed below the light emitting layer EL and disposed to cover the inclined surface of the protrusion pattern PTP, thereby changing a travelling direction of the light traveling toward the inclined surface of the light emitting layer EL towards the front direction.

The first reflective layer RFL1 can be formed of a metal material, for example, can be formed of a metal material such as aluminum (Al), silver (Ag), copper (Cu), a magnesium-silver alloy (Mg:Ag), or the like, but various embodiments of the present disclosure are not limited thereto.

The second light emitting element OLED2*a* includes the second anode electrode ANO2, the light emitting layer EL, and the cathode electrode CAT. The second anode electrode ANO2, the light emitting layer EL, and the cathode electrode CAT can be sequentially stacked in the front direction of the sensor area SA. Here, the light emitting layer EL and the cathode electrode CAT can be formed in the same or substantially the same manner as the light emitting layer EL and the cathode electrode CAT included in the first light emitting element OLED1. Furthermore, the cathode electrode CAT constituting the second light emitting element OLED2*a* can be electrically connected to or formed integrally with the cathode electrode CAT constituting the first light emitting element OLED1.

The second anode electrode ANO2 can include a second lower transparent conductive layer RTC2, a second upper transparent conductive layer FTC2, and the second reflective layer RFL2 that are electrically connected to the thin film transistor TFT. Meanwhile, the structure of the second anode electrode ANO2 can be different from the structure of the first anode electrode ANO1 of the first light emitting element OLED1 described above.

The second reflective layer RFL2 can be disposed between the second lower transparent conductive layer RTC2 and the second upper transparent conductive layer FTC2. The second lower transparent conductive layer RTC2 is electrically connected to the common transparent electrode CTE, and the second upper transparent conductive layer FTC2 is electrically connected to the light emitting layer EL. The second upper transparent conductive layer FTC2 and the second lower transparent conductive layer RTC2 can at least partially contact each other, but various embodiments of the present disclosure are not limited thereto. The second upper transparent conductive layer FTC2 and the second lower transparent conductive layer RTC2 can be spaced apart from each other by the second reflective layer RFL2 disposed therebetween.

The second anode electrode ANO2 is disposed on the common transparent electrode CTE to cover an inclined surface of the protrusion pattern PTP. For example, the second anode electrode ANO2 is disposed on at least portions of the flat surface of the common transparent electrode CTE on which the protrusion pattern PTP is not disposed, the inclined surface of the protrusion pattern PTP, and the flat surface of the protrusion pattern PTP. The second anode electrode ANO2 is disposed along shapes of the common transparent electrode CTE and the protrusion pattern PTP.

In one example, the second upper transparent conductive layer FTC2 and the second lower transparent conductive layer RTC2 can be disposed along the shapes (e.g., following the outer surfaces) of the common transparent electrode CTE and the protrusion pattern PTP. In addition, the second reflective layer RFL2 can also be disposed along the shapes (e.g., following the outer surfaces) of the common transparent electrode CTE and the protrusion pattern PTP, but are not limited thereto. The second anode electrode ANO2 can be disposed only along the flat surface of the common transparent electrode CTE where the protrusion pattern PTP is not disposed, and along the inclined surface of the protrusion pattern PTP. For example, the entire second anode electrode ANO2 can be contained within the protrusion pattern PTP so that the top surface of the second upper transparent conductive layer FTC2 and the top surface of the protrusion pattern PTP can be coplanar or substantially coplanar.

The second reflective layer RFL2 of the second anode electrode ANO2 is disposed on the second lower transparent conductive layer RTC2. Since the display device according to various embodiments of the present disclosure is the light emitting display device of the top emission type, the second reflection layer RFL2 reflects light emitted from the second light emitting element OLED2*a* to a front surface thereof (e.g., the front direction).

The second reflective layer RFL2 can be formed of a metal material, for example, can be formed of a metal material such as aluminum (Al), silver (Ag), copper (Cu), magnesium-silver alloy (Mg:Ag) or the like, but various embodiments of the present disclosure are not limited thereto.

The second reflective layer RFL2 according to various embodiments of the present disclosure can include an opening that exposes a front surface (e.g., top surface) of the second lower transparent conductive layer RTC2. Although not limited to, the opening can be formed to have a width that includes at least a part of the second emission area EA2. Due to the opening, the second light emitting element OLED2*a* formed in the transmissive area TA, unlike the first light emitting element OLED1, can transmit some light (or little portion thereof) incident toward the display device in the rear direction (e.g., towards the bottom direction of the sensor area SA). Additionally, due to this opening, a camera or a sensor (e.g., infrared sensor) disposed in the rear direction of the sensor area SA can detect such light incident or transmitted from the front direction. For instance, due to the opening defined by the second reflective layer RFL2, some of the light from the second light emitting element OLED2*a* can be transmitted towards the back/rear direction of the sensor area SA so that the camera/sensor located at the back/rear area of the sensor area can detect such light for processing.

In addition, although not limited to, since the opening of the second reflective layer RFL2 is formed by removing a portion of the second reflective layer RFL2 that is disposed to be flat through removal of the protrusion pattern PTP, an area corresponding to the opening of the second reflective layer RFL2 can be included in an area corresponding to the opening of the protrusion pattern PTP.

As a variation, as the opening is formed in the second reflective layer RFL2, light traveling in the rear direction among light generated from the second light emitting element OLED2*a* generally moves in the rear direction as it is but then can disappear. In this manner, if the light directed in the rear direction disappears as it is, luminance or color expression quality in the sensor area SA or transmissive area TA can be degraded. To address this issue, in the display device according to various embodiments of the present disclosure, the second anode electrode ANO2 further includes a light extraction layer LE, which can fill the entire opening of the second reflective layer RFL2.

The light extraction layer LE is disposed between the second lower transparent conductive layer RTC2 and the second upper transparent conductive layer FTC2. The light extraction layer LE fills the opening formed in the second reflective layer RFL2 and is disposed between the second lower transparent conductive layer RTC2 and the second upper transparent conductive layer FTC2. A rear surface (e.g., bottom surface) of the light extraction layer LE is in contact with the second lower transparent conductive layer RTC2, a front surface (e.g., top surface) of the light extraction layer LE is in contact with a lower or bottom surface of the second upper transparent conductive layer FTC2. Further, a side surface of the light extraction layer LE is in contact with the second reflective layer RFL2. For example, the light extraction layer LE can be surrounded by the second lower transparent conductive layer RTC2, the second upper transparent conductive layer FTC2, and the second reflective layer RFL2.

The light extraction layer LE contains a medium having a refractive index higher than those of the second lower transparent conductive layer RTC2 and the second upper transparent conductive layer FTC2. In other words, the light extraction layer LE has a refractive index higher than those of the second lower transparent conductive layer RTC2 and the second upper transparent conductive layer FTC2. Accordingly, light that is introduced into an inside of the light extraction layer LE moves in a lateral direction by total reflection and travels in the front direction by the second reflection layer RFL2.

As described above, the display device according to various embodiments of the present disclosure includes a light extraction layer LE of which upper and lower surfaces are surrounded by a medium with a low (or lower) refractive index and side surfaces are surrounded by a medium with a high (or higher) reflectance. Thus, even if the opening is formed in the second reflective layer RFL2, light can be transmitted as much as possible to in the front direction. As a result, the display device according to various embodiments of the present disclosure can maintain an excellent opening ratio and transmittance in the transmissive area TA and at the same time, can also improve quality of an image that is expressed in the second emission area EA2.

As noted above, the first upper transparent conductive layer FTC1 is disposed on the first reflective layer RFL1 and is electrically connected to at least one of the first reflective layer RFL1 and/or the first lower transparent conductive layer RTC1. The first upper transparent conductive layer FTC1 can be formed of a conductive material with a high work function in order to supply holes to the light emitting layer EL. For example, the first upper transparent conductive layer FTC1 can be formed of indium tin oxide (ITO), indium zinc oxide (IZO), indium tin zinc oxide (ITZO), zinc oxide (ZnO) and tin oxide (TO)-based transparent conductive oxides, but various embodiments of the present disclosure are not limited thereto. For example, when the first upper transparent conductive layer FTC1 is formed of indium tin oxide (ITO), a refractive index of the first upper transparent conductive layer FTC1 can be about 1.8.

On the other hand, the second upper transparent conductive layer FTC2 is disposed on the second reflective layer RFL2 and the light extraction layer LE. The second upper transparent conductive layer FTC2 is electrically connected to at least one of the second reflective layer RFL2 and/or the second lower transparent conductive layer RTC2. The second upper transparent conductive layer FTC2 can be formed of a conductive material with a high work function in order to supply holes to the light emitting layer EL. For example, the second upper transparent conductive layer FTC2 can be formed of a transparent conductive oxide that is the same or substantially the same as or similar to the first upper transparent conductive layer FTC1, but various embodiments of the present disclosure are not limited thereto. For example, when the second upper transparent conductive layer FTC2 is formed of indium tin oxide (ITO), a refractive index of the second upper transparent conductive layer FTC2 can be about 1.8. As described above, the second upper transparent conductive layer FTC2 can have the same or substantially the same refractive index as the first upper transparent conductive layer FTC1, but various embodiments of the present disclosure are not limited thereto.

Also, although not limited to, the first lower transparent conductive layer RTC1 can be formed of a transparent conductive oxide that is the same or substantially the same as or similar to the first upper transparent conductive layer FTC1 described above. Accordingly, the first lower transparent conductive layer RTC1 can have the same or substantially the same refractive index as the first upper transparent conductive layer FTC1. The second lower transparent conductive layer RTC2 can also be formed of a transparent conductive oxide that is the same or substantially the same as or similar to the second upper transparent conductive layer FTC2 described above, and the second lower transparent conductive layer RTC2 can have the same or substantially the same refractive index as the second upper transparent conductive layer FTC2.

Hereinafter, a bank layer, the light emitting layer EL, and the cathode electrode CAT that are disposed on the first anode electrode ANO1 and the second anode electrode ANO2 will be described. For convenience of explanation, it can be understood that the anode electrodes ANO1 and ANO2 include the first anode electrode ANO1 and the second anode electrode ANO2, the light emitting elements OLED1 and OLED2 include the first light emitting element OLED1 and the second light emitting element OLED2*a*, and the reflective layers RFL1 and RFL2 include the first reflective layer RFL1 and the second reflective layer RFL2.

A bank layer PDL is disposed on the anode electrodes ANO1 and ANO2 and the protrusion pattern PTP. The bank layer PDL is disposed in the non-emission area NEA while covering portions of the anode electrodes ANO1 and ANO2 of the light emitting elements OLED1 and OLED2 (e.g., OLED2*a*) and the protrusion pattern PTP in the plurality of sub-pixels. For example, in the non-emissive area NEA, the bank layer PDL can be disposed on the anode electrodes ANO1 and ANO2 and define areas of the emissive areas EA. Since the bank layer PDL is not disposed in the emission area EA (e.g., EA1 and EA2), the light emitting layer EL is located directly on the anode electrodes ANO1 and ANO2 and light can be generated from the light emitting layer EL. Meanwhile, it is not that light is not completely emitted from the non-emission area NEA, and light can be partially output from the non-emission area NEA due to the reflective layers RFL1 and RFL2.

The bank layer PDL can be formed of an organic material. For example, the bank layer PDL can be formed of an organic material such as polyimide, acryl, or benzocyclobutene-based resin, but is not limited thereto. For example, when polyimide is used as the bank layer PDL, a refractive index of the bank layer PDL can be about 1.6.

The light emitting layers EL are disposed to be in contact with the anode electrodes ANO1 and ANO2, respectively, in the plurality of sub-pixels. For example, the light emitting layers EL can be disposed in the emission areas EA on the anode electrodes ANO1 and ANO2, respectively. For example, the light emitting layers EL can be disposed to be surrounded by the bank layer PDL.

Each of the light emitting layers EL can be deposited in a pattern in each of the emission areas EA using a mask with openings for the respective sub-pixels, for example, a fine metal mask (FMM). The light emitting layer EL can further include various layers such as a hole transport layer, a hole injection layer, a hole blocking layer, an electron injection layer, an electron transport layer, and an electron blocking layer, and various organic layers can be formed as a single layer in all of the sub-pixels. In addition, the light emitting layer EL can be an organic light emitting layer formed of an organic material, but various embodiments of the present disclosure are not limited thereto. For example, the light emitting layer EL can be formed of a quantum-dot (QD) light emitting layer or a micro-OLED (micro-organic light emitting diode).

The cathode electrode CAT is disposed on the light emitting layers EL and the bank layer PDL in the plurality of sub-pixels. For example, the cathode electrode CAT is disposed to be in contact with the light emitting layer EL in each emission area EA and can be disposed along a shape of the light emitting layer EL. Additionally, the cathode electrode CAT is disposed to be in contact with the bank layer PDL in the non-emission area NEA and can be disposed along a shape of the bank layer PDL.

Figure 4:
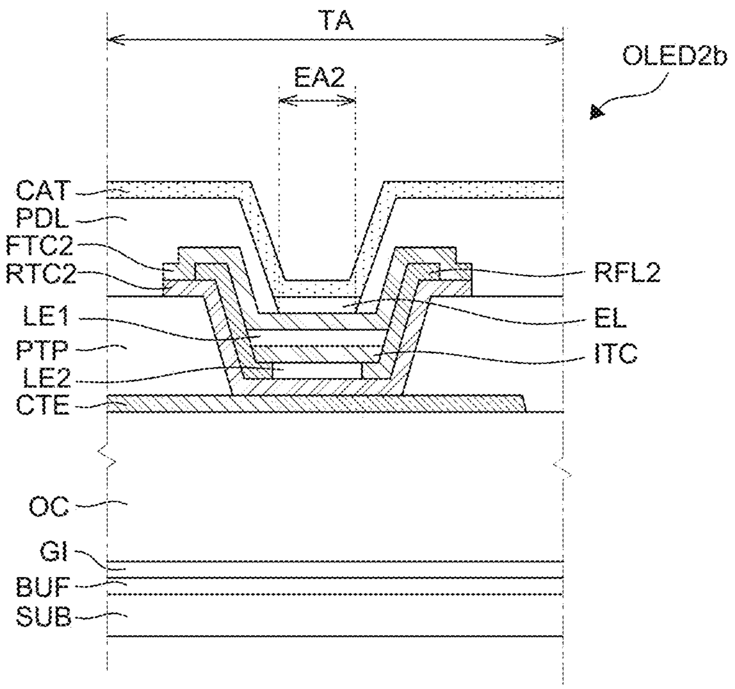
FIG. 4 is a cross-sectional view of a second light emitting element provided in a display device according to another exemplary embodiment of the present disclosure.

The cathode electrode CAT supplies electrons to the light emitting layer EL. The cathode electrode CAT can be formed of a metal material such as silver (Ag), copper (Cu), or magnesium-silver alloy (Mg:Ag), or can be formed of a transparent conductive oxide or an ytterbium (Yb) alloy, but various embodiments of the present disclosure are not limited thereto. FIG. 4 is a cross-sectional view of a second light emitting element provided in a display device according to another exemplary embodiment of the present disclosure. Particularly, FIG. 4 can illustrate a different example of the second light emitting element OLED2 of FIG. 3. In this manner, a display device can be provided, which is the same as the display device of FIG. 3, except that the second light emitting element OLED2*a* is substituted by a second light emitting element OLED2*b* shown in FIG. 4.

Referring to FIG. 4, the second light emitting element OLED2*b* can be disposed on the common transparent electrode CTE and the protrusion pattern PTP, and includes a second anode electrode ANO2, a light emitting layer, and a cathode electrode CAT. According to this embodiment of the present disclosure, descriptions of other components are the same or substantially the same as those described above with reference to FIG. 3, except that the second anode electrode ANO2 includes a second reflective layer RFL2, a second lower transparent conductive layer RTC2, a second upper transparent conductive layer FTC2, one or two or more intermediate transparent conductive layers ITC, and a plurality of light extraction layers LE. Thus, redundant descriptions will be omitted or may be briefly provided. Furthermore, descriptions of the second reflective layer RFL2, the second lower transparent conductive layer RTC2, and the second upper transparent conductive layer FTC2 are also the same or substantially the same as those of the second light emitting element OLED2*a* described above with reference to FIG. 3. Thus, redundant descriptions will be omitted or may be briefly provided.

The plurality of light extraction layers LE are disposed between the second lower transparent conductive layer RTC2 and the second upper transparent conductive layer FTC2. The one or two or more intermediate transparent conductive layers ITC are disposed between the plurality of light extraction layers LE. For example, if two light extraction layers LE are provided, one intermediate transparent conductive layer ITC is disposed between them, if three light extraction layers LE are provided, two intermediate transparent conductive layers ITC are disposed between them (e.g., alternatingly), and so on. in the example of FIG. 4, the intermediate transparent conductive layer ITC is disposed between the two light extraction layers LE1 and LE2 in a vertical direction. Other variations are possible.

Each of the plurality of light extraction layers LE (e.g., LE1 and LE2) is disposed to be flat or to form a flat front surface. Since the intermediate transparent conductive layer ITC and the second upper transparent conductive layer FTC2 are disposed along a surface shape of the light extraction layer LE, the intermediate transparent conductive layer ITC and the second upper transparent conductive layer FTC2 are also disposed to be flat in the emission area EA2.

In this manner, as the plurality of light extraction layers LE and the one or more intermediate transparent conductive layers ITC are alternately disposed, the second light emitting element OLED2*b* can transmit more light generated from the light emitting layer EL to the second reflective layer RFL2 disposed at a side thereof. Accordingly, the amount of light that is confirmed in a front direction of the second emission area EA2 can increase.

Meanwhile, the intermediate transparent conductive layer ITC can be formed of a material that is the same or substantially the same as or similar to the second lower transparent conductive layer RTC2 or the second upper transparent conductive layer FTC2, and accordingly, it can have the same or substantially the same refractive index as the second upper transparent conductive layer FTC2 or the second lower transparent conductive layer RTC2. In addition, the intermediate transparent conductive layer ITC can be formed of a material different from the second lower transparent conductive layer RTC2 or the second upper transparent conductive layer FTC2, but can be formed of a material selected from among transparent materials so that a refractive index of the intermediate transparent conductive layer ITC is lower than that of the light extraction layer LE.

Figure 5:
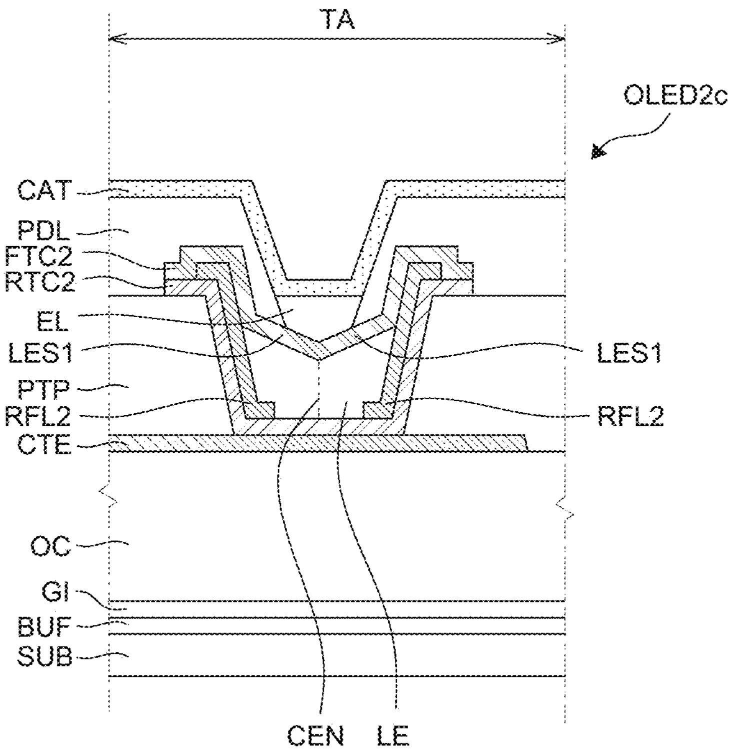
FIG. 5 is a cross-sectional view of a second light emitting element provided in a display device according to still another exemplary embodiment of the present disclosure.

FIG. 5 is a cross-sectional view of a second light emitting element provided in a display device according to still another exemplary embodiment of the present disclosure. Particularly, FIG. 5 can illustrate another different example of the second light emitting element OLED2 of FIG. 3. In this manner, a display device can be provided, which is the same as the display device of FIG. 3, except that the second light emitting element OLED2*a* is substituted by a second light emitting element OLED2*c* shown in FIG. 5.

Referring to FIG. 5, the second light emitting element OLED2*c* can be disposed on the common transparent electrode CTE and the protrusion pattern PTP, and includes a second anode electrode ANO2, a light emitting layer EL, and a cathode electrode CAT. According to this embodiment of the present disclosure, descriptions of other components are the same or substantially the same as those described with reference to FIG. 3, with the exception that a light extraction layer LE included in the second anode electrode ANO2 has an inclined surface on a front surface (e.g., top surface) thereof, and a second upper transparent conductive layer FTC2 also has an inclined surface LES1 according to or following the shape or top surface of the light extraction layer LE. Thus, redundant descriptions will be omitted or may be briefly provided. Furthermore, descriptions of the second reflective layer RFL2 and the second lower transparent conductive layer RTC2 are the same or substantially the same as those of the second light emitting element OLED2*a* described above with reference to FIG. 3, and thus, are also omitted or may be briefly provided.

The light extraction layer LE is disposed between the second lower transparent conductive layer RTC2 and the second upper transparent conductive layer FTC2. The light extraction layer LE can have an inclined surface with a predetermined slope on the front surface (e.g., top surface) thereof. For example, due to the inclined surface, the light extraction layer LE can be configured to have a height that gradually decreases toward a center portion CEN of the second light emitting element OLED2*c*. In one example, the inclined surface of the light extraction layer LE can be configured with a straight surface or a curved surface, or a combination thereof, but various embodiments of the present disclosure are not limited thereto.

The second upper transparent conductive layer FTC2 is disposed along a surface shape of the light extraction layer LE. Accordingly, the second upper transparent conductive layer FTC2 can also include an inclined surface (or inclined surface portion) LES1 on a front/top surface area thereof. The inclined surface (or portion) LES1 formed at the second upper transparent conductive layer FTC2 can have an inclination angle that is the same or substantially the same as the inclined surface forming the front/top surface of the light extraction layer LE.

As described above, by forming the inclined surface at the front/top surface of the light extraction layer LE, light extraction efficiency can be improved and the amount of light that is confirmed to be directed towards the front direction of the second emission area EA2 can be increased.

Figure 6:
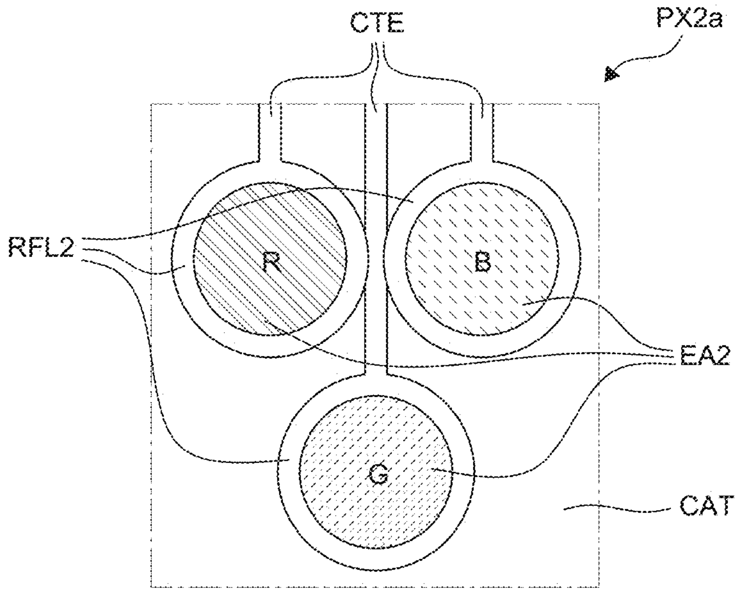
FIGS. 6 and 7 are plan views of pixels according to various examples of the present disclosure.
Figure 7:
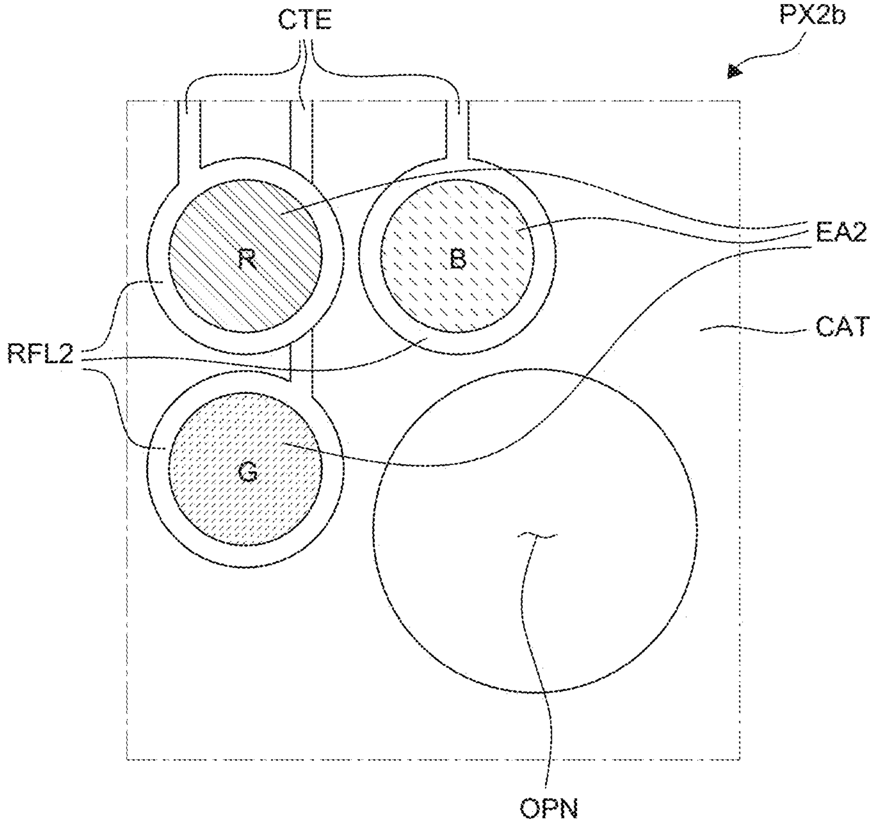

FIGS. 6 and 7 are plan views of pixels according to various examples of the present disclosure. Particularly, a pixel PX2*a* and a pixel PX2*b* shown in FIGS. 6 and 7 can be different examples of the second pixel PX2 of FIG. 2 disposed in the transmissive area TA of the sensor area SA.

Referring to FIGS. 2, 3, 6, and 7, each of the pixels PX2, PX2*a*, and PX2*b* disposed in the transmissive area TA includes a plurality of sub-pixels (e.g., a red sub-pixel R, a green sub-pixel G, and a blue sub-pixel B). Such plurality of sub-pixels can respectively express red, blue, and green colors, but various embodiments of the present disclosure are not limited thereto. For example, the plurality of sub-pixels can be additionally configured to express various colors such as white, yellow, cyan, and magenta.

The sub-pixels R, G, and B disposed in the transmissive area TA share the common transparent electrode CTE with the sub-pixels disposed in the non-transmissive area TA, respectively. The common transparent electrode CTE is electrically connected to the drain electrode D of the thin film transistor TFT disposed in the non-transmissive area TA, and a driving voltage can be applied to each of the sub-pixels disposed in the transmissive area TA and the non-transmissive area TA through the common transparent electrodes CTE.

Meanwhile, the sub-pixels that share the common transparent electrode CTE are determined to be sub-pixels that express the same color. For example, red, blue, and green sub-pixels disposed in the non-transmissive area TA are connected to red, blue, and green sub-pixels disposed in the transmissive area TA, respectively, through a respective common transparent electrodes CTE, and are not connected to sub-pixels of other colors by the common transparent electrodes CTE.

The second emission areas EA2 of the sub-pixels R, G, and B disposed in the transmissive area TA of the second pixel PX2, PX2*a*, PX2*b* are surrounded by the second reflection layers RFL2 when the display device is viewed from the front. This is because the light emitting layer EL is disposed on the second anode electrode ANO2 according to the shape of the second anode electrode ANO2. Meanwhile, in an exemplary embodiment of the present disclosure, each second emission area EA2 can have a circular shape, but various embodiments are not limited thereto. Each second emission area EA2 can be designed in various shapes such as an oval shape, a triangular shape, or a square shape.

Referring to the example of FIG. 6, the cathode electrode CAT disposed in the transmissive area TA may not include an opening (e.g., an opening OPN in FIG. 7). In order to provide an opening in the cathode electrode CAT, a patterning process can be performed. However, according to various embodiments of the present disclosure, since a sufficient opening ratio and transmittance are secured in the second emission area EA2, the patterning process can be omitted and the display device can be manufactured more economically. In addition, sub-pixels with a larger area can be disposed in spaces where openings should be provided, so that display quality in the transmissive area TA can be entirely improved.

Referring to the example of FIG. 7 which is different from the example of FIG. 6, the cathode electrode CAT disposed in the transmissive area TA can include an opening OPN. When the opening OPN is provided in the cathode electrode CAT, an opening ratio and transmittance in the transmissive area TA can be further improved in proportion to an area of the opening OPN. In both FIGS. 6 and 7, the locations of the sub-pixels R, B, and G and the opening OPN can vary, so that the sub-pixels R, B and G and the opening OPN can be provided at different locations within the pixel.

Figure 8:
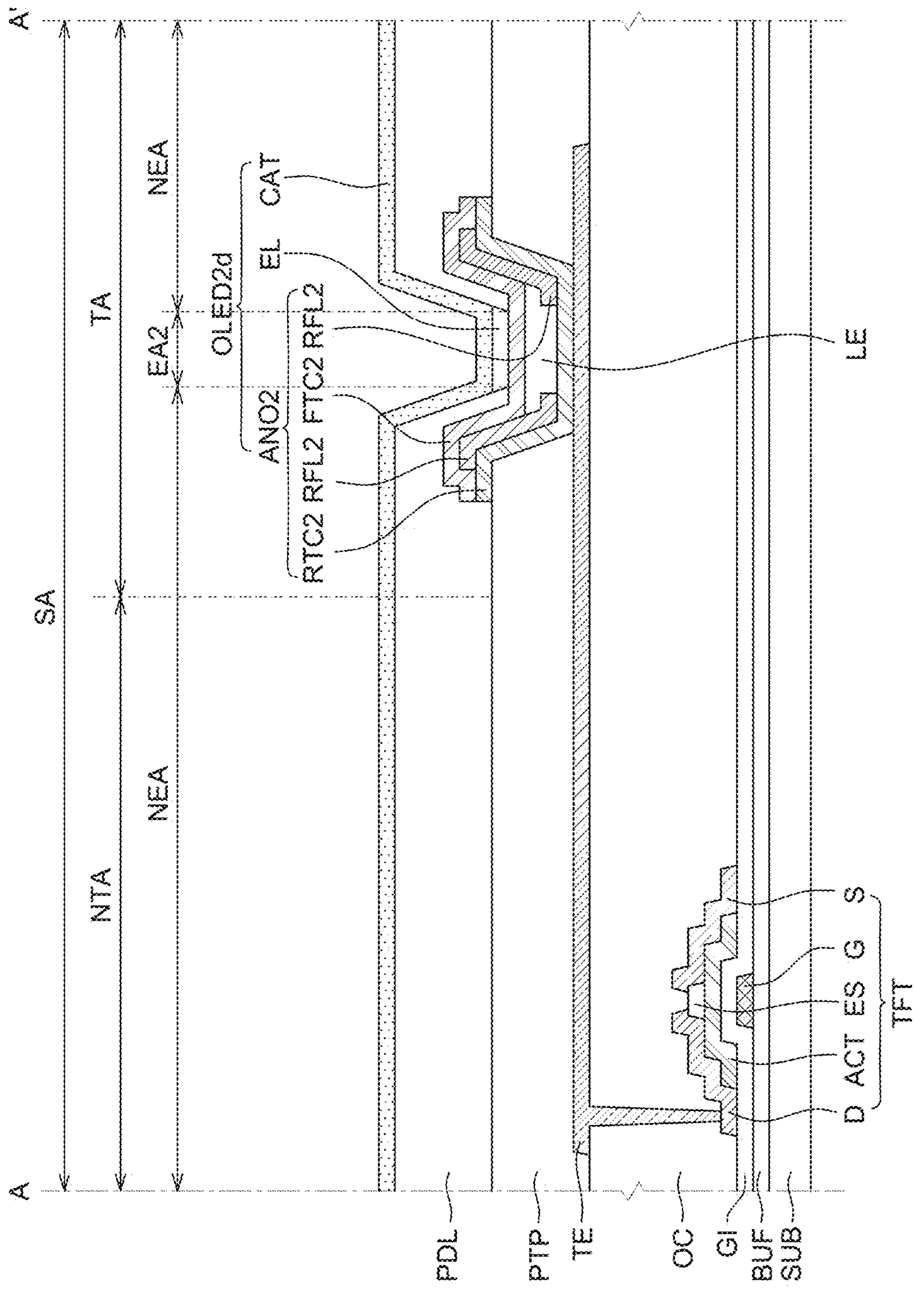
FIG. 8 is a cross-sectional view of a display device according to yet another exemplary embodiment of the present disclosure, and more specifically illustrates another example of a cross-section taken along line A-A' of the display device of FIG. 2.

FIG. 8 is a cross-sectional view of a display device according to yet another exemplary embodiment of the present disclosure. More specifically, FIG. 8 illustrates another example of a cross-section taken along line A-A' of the display device of FIG. 2

Referring to FIG. 8, a transparent electrode TE is disposed on the overcoating layer OC. The transparent electrode TE can be disposed on a flat surface of the overcoating layer OC. One surface (e.g., a rear surface) of the transparent electrode TE can be electrically connected to the drain electrode D of the thin film transistor TFT through a contact hole formed in the overcoating layer OC. Additionally, the other surface (e.g., a front surface) of the transparent electrode TE can be electrically connected to a second anode electrode ANO2 included in a second light emitting element OLED2*d*.

The second light emitting element OLED2*d* is disposed in the transmissive area TA and can be connected to the thin film transistor TFT disposed in the non-transmissive area NTA through the transparent electrode TE. Accordingly, a driving voltage that is supplied from the thin film transistor TFT disposed in the non-transmissive area NTA is transmitted to the second anode electrode ANO2 of the second light emitting element OLED2*d* through the transparent electrode TE, and the second light emitting element OLED2*d* can generate light based on the driving voltage. The second light emitting element OLED2*d* can have the same or similar configuration as the second light emitting element OLED2*a* of FIG. 3. Thus the description of the second light emitting OLED2*d* can be referred to the description of the second light emitting element OLED2*a* provided above.

As described above, as the thin film transistor TFT for driving the second light emitting element OLED2*d* disposed in the transmissive area TA is disposed in the non-transmissive area NTA other than the transmissive area TA, transmittance of the transmissive area TA can increase.

Meanwhile, in this embodiment, a first light emitting element located in the non-transmissive area NTA can be connected to a separate thin film transistor located in the non-transmissive area NTA through an opaque electrode. For example, the first light emitting element located in the non-transmissive area NTA and the second light emitting element OLED2*d* located in the transmissive area TA can be driven independently of each other, e.g., different transistors can respectively and independently drive the first and second light emitting elements of a display device associated with FIG. 8. In FIG. 8, since the first light emitting element is not driven by the thin film transistor TFT shown in FIG. 8 (which drives the second light emitting element OLED2*d*), the first light emitting element is not present in FIG. 8. The display device of FIG. 8 can have other elements such as those having the same reference numerals shown in the display devices of other figures.

According to various aspects of the present disclosure, display devices that have improved transmittance, lower manufacturing costs, and simplified manufacturing steps, etc. are provided.

Some aspects of the exemplary embodiments of the present disclosure can also be described as follows:

A display device according to an aspect of the present disclosure includes a substrate including a non-transmissive area and a transmissive area; a first light emitting element disposed in the non-transmissive area; a second light emitting element disposed in the transmissive area; and a thin film transistor disposed in the non-transmissive area and configured to drive the second light emitting element, wherein the first light emitting element generates light in a first emission area, wherein the second light emitting element generates light in a second emission area, and wherein the thin film transistor can be electrically connected to the second anode electrode of the second light emitting element through a transparent electrode.

According to an aspect of the present disclosure, the transmissive area can be surrounded by the non-transmissive area. The transparent electrode can start from the non-transmissive area and extends to the transmissive area. The thin film transistor can be electrically connected to the first anode electrode of the first light emitting element through the transparent electrode.

According to an aspect of the present disclosure, the first anode electrode of the first light emitting element and the second anode electrode of the second light emitting element can be disposed on the transparent electrode. The first anode electrode can include a first lower transparent conductive layer, a first upper transparent conductive layer, and a first reflective layer located between the first lower transparent conductive layer and the first upper transparent conductive layer.

According to an aspect of the present disclosure, the second anode electrode can include a second lower transparent conductive layer, a second upper transparent conductive layer, and a second reflective layer located between the second lower transparent conductive layer and the second upper transparent conductive layer.

According to an aspect of the present disclosure, in the second emission area, the second reflective layer can have an opening that exposes a front surface of the second lower transparent conductive layer. The second anode electrode can further include a light extraction layer. The light extraction layer can be disposed on the second lower transparent conductive layer.

According to an aspect of the present disclosure, the light extraction layer can be disposed in the second reflective layer. The light extraction layer can be surrounded by the second lower transparent conductive layer, the second upper transparent conductive layer, and the second reflective layer. The light extraction layer can have a refractive index greater than those of the second lower transparent conductive layer and the second upper transparent conductive layer.

According to an aspect of the present disclosure, the display device can further comprise a protrusion pattern disposed on the transparent electrode and having an opening that at least partially exposes a front surface of the transparent electrode. The second anode electrode can be disposed on the transparent electrode to cover an inclined surface of the protrusion pattern. The opening of the second reflective layer can be formed to have a width that includes at least a portion of the second emission area. An area corresponding to the opening of the second reflective layer can be included in an area corresponding to the opening of the protrusion pattern.

According to an aspect of the present disclosure, the light extraction layer can fill the opening of the second reflective layer and can be disposed to have a flat front surface. The second anode electrode can include an additional light extraction layer and one or more intermediate transparent conductive layers. The light extraction layers including the additional light extraction layer, and the transparent conductive layers including the second upper transparent conductive layer, the second lower transparent conductive layer, and the intermediate transparent conductive layer can be alternately disposed.

According to an aspect of the present disclosure, the light extraction layer can have an inclined surface having a predetermined slope on a front surface thereof. A height of the light extraction layer gradually can decrease toward a center of the second light emitting element. The second upper transparent conductive layer can be disposed along a surface shape of the light extraction layer. The display device can further comprise an overcoating layer disposed on the thin film transistor. The transparent electrode can be disposed on the overcoating layer and can be electrically connected to the thin film transistor. The transparent electrode can be disposed to be flat.

According to an aspect of the present disclosure, a display device includes a display panel including a display area configured to display images and a non-display area disposed adjacent to the display area, wherein the display area includes a sensor area and a non-sensor area adjacent to the sensor area, wherein the sensor area includes first and second transmittance areas having different transmittances, wherein the first and second transmittance areas in the sensor area include first and second light emitting elements, respectively, and wherein the first and second light emitting elements include respectively first and second electrodes having respectively first and second light reflective layers. The display device further includes a light extraction layer disposed on the second light reflective layer, but not on the first light reflective layer, a thin film transistor disposed in the first transmittance area of the sensor area, and a transparent electrode disposed in both the first and second transmittance areas, and electrically connecting the thin film transistor to the second light emitting elements.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including a non-transmissive area and a transmissive area, the non-transmissive area having a first emission area, and the transmissive area having a second emission area;

a first light emitting element disposed in the non-transmissive area and including a first anode electrode;

a second light emitting element disposed in the transmissive area and including a second anode electrode;

a thin film transistor disposed in the non-transmissive area and configured to drive at least the second light emitting element; and a transparent electrode electrically connecting the thin film transistor to the second anode electrode of the second light emitting element, wherein the first light emitting element generates light in the first emission area, wherein the second light emitting element generates light in the second emission area, and wherein structures of the first anode electrode and the second anode electrode are different from each other.

2. The display device of claim 1, wherein the transmissive area is surrounded by the non-transmissive area.

3. The display device of claim 1, wherein the transparent electrode extends from the non-transmissive area into the transmissive area.

4. The display device of claim 1, wherein the transparent electrode further connects electrically the thin film transistor to the first anode electrode of the first light emitting element, so that the thin film transistor is configured to commonly drive the first and second light emitting elements.

5. The display device of claim 4, wherein the first anode electrode of the first light emitting element and the second anode electrode of the second light emitting element are disposed on the same transparent electrode.

6. The display device of claim 1, wherein the first anode electrode includes:

a first lower transparent conductive layer disposed on the transparent electrode, a first upper transparent conductive layer, and a first reflective layer located between the first lower transparent conductive layer and the first upper transparent conductive layer.

7. The display device of claim 1, wherein the second anode electrode includes:

a second lower transparent conductive layer disposed on the transparent electrode, a second upper transparent conductive layer, and a second reflective layer located between the second lower transparent conductive layer and the second upper transparent conductive layer, and wherein in the second emission area, the second reflective layer has an opening that exposes a surface of the second lower transparent conductive layer.

8. The display device of claim 7, wherein the second anode electrode further includes a light extraction layer disposed on the second lower transparent conductive layer.

9. The display device of claim 8, wherein the light extraction layer is surrounded by the second lower transparent conductive layer, the second upper transparent conductive layer, and the second reflective layer.

10. The display device of claim 8, wherein the light extraction layer has a refractive index greater than a refractive index of the second lower transparent conductive layer or a refractive index of the second upper transparent conductive layer.

11. The display device of claim 8, further comprising:

a protrusion pattern disposed on the transparent electrode and having an opening that at least partially exposes a surface of the transparent electrode.

12. The display device of claim 11, wherein the second anode electrode is disposed on the transparent electrode and covers an inclined surface of the protrusion pattern defined by the opening of the protrusion pattern.

13. The display device of claim 12, wherein the opening of the second reflective layer corresponds to at least a portion of the second emission area.

14. The display device of claim 11, wherein an area corresponding to the opening of the second reflective layer is included in an area corresponding to the opening of the protrusion pattern.

15. The display device of claim 8, wherein the light extraction layer fills the opening of the second reflective layer and is disposed to have a flat surface.

16. The display device of claim 8, wherein the second anode electrode includes an additional light extraction layer and one or more intermediate transparent conductive layers, and wherein the light extraction layers including the additional light extraction layer, and the transparent conductive layers including the second upper transparent conductive layer, the second lower transparent conductive layer, and the intermediate transparent conductive layer are alternately disposed.

17. The display device of claim 8, wherein a top surface of the light extraction layer is inclined with a predetermined slope, and wherein a height of the light extraction layer gradually decreases toward a center portion of the second light emitting element.

18. The display device of claim 17, wherein the second upper transparent conductive layer is disposed on the light extraction layer, so that a top surface of the second upper transparent conductive layer is inclined.

19. The display device of claim 1, further comprising:

an overcoating layer disposed on the thin film transistor, wherein the transparent electrode is disposed on the overcoating layer and is electrically connected to the thin film transistor, and wherein the transparent electrode is disposed to be flat.

20. A display device, comprising:

a display panel including a display area configured to display images and a non-display area disposed adjacent to the display area, wherein the display area includes a sensor area and a non-sensor area adjacent to the sensor area, wherein the sensor area includes first and second transmittance areas having different transmittances, wherein the first and second transmittance areas in the sensor area include first and second light emitting elements, respectively, and wherein the first and second light emitting elements include respectively first and second electrodes having respectively first and second light reflective layers;

a light extraction layer disposed on the second light reflective layer, but not on the first light reflective layer; and a thin film transistor disposed in the first transmittance area of the sensor area, and a transparent electrode disposed in both the first and second transmittance areas, and electrically connecting the thin film transistor to the second light emitting elements.

* * * * *